United States Patent
Han et al.

(10) Patent No.: US 11,705,803 B1
(45) Date of Patent: Jul. 18, 2023

(54) GATE DRIVER WITH IMPROVED SWITCHING PERFORMANCE AND THE DRIVING METHOD THEREOF

(71) Applicant: Monolithic Power Systems, Inc., Kirkland, WA (US)

(72) Inventors: Di Han, San Jose, CA (US); Jian Jiang, Saratoga, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 0 days.

(21) Appl. No.: 17/851,221

(22) Filed: Jun. 28, 2022

(51) Int. Cl.
*H02M 1/08* (2006.01)
*H03K 17/687* (2006.01)

(52) U.S. Cl.
CPC .......... *H02M 1/08* (2013.01); *H03K 17/6871* (2013.01)

(58) Field of Classification Search
CPC ............................ H02M 1/08; H03K 17/6871
See application file for complete search history.

(56) References Cited

U.S. PATENT DOCUMENTS

| | | | |
|---|---|---|---|
| 9,793,260 B2 * | 10/2017 | Zojer | H03K 17/567 |
| 11,088,688 B2 | 8/2021 | Pala | |
| 2013/0076322 A1 * | 3/2013 | Tateno | H02M 3/158 |
| | | | 323/271 |

OTHER PUBLICATIONS

U.S. Appl. No. 17/229,463, filed Apr. 13, 2021, Monolithic Power Systems.
U.S. Appl. No. 16/999,942, filed Aug. 21, 2020, Monolithic Power Systems.
U.S. Appl. No. 17/239,333, filed Apr. 23, 2021, Monolithic Power Systems.

* cited by examiner

*Primary Examiner* — Metasebia T Retebo
(74) *Attorney, Agent, or Firm* — Perkins Coie LLP

(57) ABSTRACT

A gate driver is configured to drive a normally-on device and a normally-off device coupled in series. The gate driver controls the normally-on device in response to a PWM signal, and to control a normally-off device to maintain ON in normal operations. If an under voltage condition of a negative power supply of a first driver used to drive the normally-on device, or a positive power supply of a second driver used to drive the normally-off device, or an input supply voltage is detected, the normally-off device is controlled to be OFF.

17 Claims, 4 Drawing Sheets

US 11,705,803 B1

GATE DRIVER WITH IMPROVED SWITCHING PERFORMANCE AND THE DRIVING METHOD THEREOF

FIELD

The present invention relates to electronic circuits, more specifically, the present invention relates to gate driver and the driving method thereof.

BACKGROUND

In high voltage applications, MOSFETs are preferred due to their normally-off characteristic, which reduces power loss in the gate drive. However, high voltage MOSFETs suffer from relatively high turn-on resistance and gate oxide degradation issues. As an alternative, normally-on power devices, such as JFETs have no gate oxide and superior turn-on resistance.

Conventionally, the JFETs are driven with a cascode structure. As illustrated in FIG. 1, a JFET structure 100 is schematically shown. As shown in FIG. 1, the JFET structure comprises a JFET J1 and a MOSFET M1. Typically, the JFET J1 is a high voltage normally-on device without applying a negative gate-source voltage, while the MOSFET M1 is a low voltage normally-off device without applying a positive gate-source voltage. By applying appropriate voltage at the gate of the MOSFET M1, the JFET structure 100 is controlled to be ON and OFF.

The JFET structure 100 is simple. However, the structure needs one MOSFET for each JFET. Besides, the structure has no direct access to JFET's gate, which leads to no slew rate control. Further, the low voltage MOSFET suffers from significant voltage overstress because of the hard switching turn-off. Thus, additional strong clamping is needed for the MOSFET.

SUMMARY

It is an object of the present invention to provide an improved gate driver, which solves the above problems.

In accomplishing the above and other objects, there has been provided, in accordance with an embodiment of the present invention, a gate driver, configured to drive a power device, the power device having a normally-on device and a normally-off device coupled in series between a first terminal and a second terminal. The gate driver comprises: a first driver, configured to receive a PWM signal, and to drive the normally-on device; a second driver, configured to drive the normally-off device; and an under voltage detector. The under voltage detector is configured to detect an under voltage condition of a negative power supply of the first driver, a positive power supply of the second driver, and an input supply voltage. If any one of the negative power supply, the input supply voltage, or the positive power supply is in an under voltage condition, the normally-off device is controlled to be OFF by the second driver.

In addition, there has been provided, in accordance with an embodiment of the present invention, a gate driver, configured to drive a half-bridge circuit, the half-bridge circuit having a high-side power device and a low-side power device, the high-side power device including a first normally-on device and a normally-off device coupled in series between a first terminal and a second terminal, the low-side power device including a second normally-on device coupled between the second terminal and a reference ground. The gate driver comprises: a first driver, configured to receive a PWM signal, and to drive the first normally-on device; a second driver, configured to drive the normally-off device; a third driver, configured to receive the PWM signal, and to drive the second normally-on device; and an under voltage detector. The under voltage detector is configured to detect an under voltage condition of a first negative power supply of the first driver, an input supply voltage, and a positive power supply of the second driver. If any one of the negative power supply, the input supply voltage, or the positive power supply is in an under voltage condition, the normally-off device is controlled to be OFF by the second driver.

Furthermore, there has been provided, in accordance with an embodiment of the present invention, a driving method, comprising: controlling a normally-on device to switch between ON and OFF statuses in response to a PWM signal, the normally-on device being controlled to be OFF by pulling a control terminal of the device to a negative power supply; controlling a normally-off device to maintain an ON status by pulling a control terminal of the normally-off device to a positive power supply, the normally-on device being coupled in series with the normally-off device; and monitoring an under voltage condition of the negative power supply and the positive power supply: if any one of the negative power supply or the positive power supply is in the under voltage condition, turning off the normally-off device.

The use of the similar reference label in different drawings indicates the same of like components.

DETAILED DESCRIPTION

Embodiments of circuits for gate driver are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
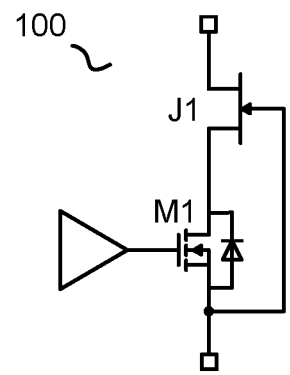
FIG. 1 schematically shows a conventional JFET structure 100.
Figure 2:
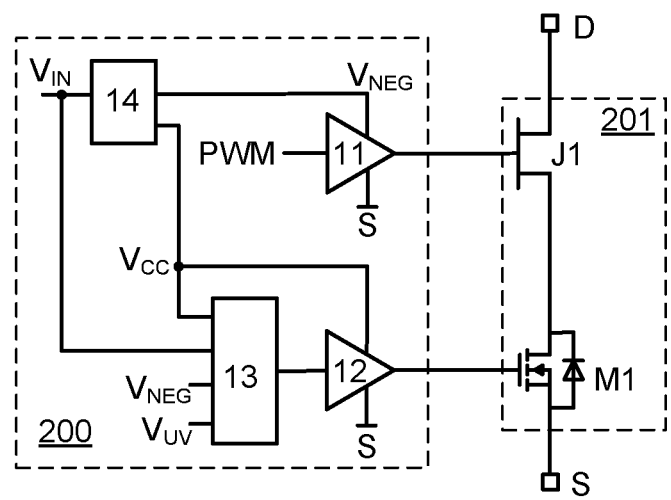
FIG. 2 schematically shows a gate driver 200 in accordance with an embodiment of the present invention.

FIG. 2 schematically shows a gate driver 200 in accordance with an embodiment of the present invention. In the example of FIG. 2, the gate driver 200 is configured to drive a power device 201. The power device 201 comprises a normally-on device J1 and a normally-off device M1 coupled in series between a first terminal D and a second terminal S. The gate driver 200 comprises: a first driver 11, configured to receive a PWM signal, and to drive the normally-on device J1; and a second driver 12, configured to drive the normally-off device M1. The gate driver 200 further comprises: an under voltage detector 13, configured to detect an under voltage condition of a negative power supply $V_{NEG}$ of the first driver 11, a positive power supply $V_{CC}$ of the second driver 12, and an input supply voltage $V_{IN}$. If any one of the negative power supply $V_{NEG}$, the input supply voltage $V_{IN}$, or the positive power supply $V_{CC}$ is in an under voltage condition, the normally-off device M1 is controlled to be OFF by the second driver 12.

In one embodiment of the present invention, the gate driver 200 further comprises a converting circuit 14, configured to convert the input supply voltage $V_{IN}$ to the positive power supply $V_{CC}$ (e.g., the converting circuit 14 may comprise a low dropout regulator to perform the conversion), and to convert the input supply voltage $V_{IN}$ to the negative power supply $V_{NEG}$ (e.g., the converting circuit 14 may comprise a charge pump to perform the conversion).

One skilled in the art should realize that the term "normally-on device" in one embodiment of the present invention means that the device has an original conducting channel, and is in the ON status if no sufficient negative voltage is applied to the control terminal of the device. The term "normally-off device" in one embodiment of the present invention means that the device has no original conducting channel, and is in the OFF status if no sufficient positive voltage is applied to the control terminal of the device.

In one embodiment of the present invention, the normally-on device comprises a JFET; and the normally-off device comprises a MOSFET.

In one embodiment of the present invention, the normally-on device comprises a high voltage device, which can typically sustain hundreds or even thousands of voltages; and the normally-off device comprises a low voltage device, which can typically sustain tens of voltages.

In normal operations, the normally-off device M1 is controlled to maintain an ON status by the second driver 12. In the event of the under voltage condition of the negative power supply $V_{NEG}$, the input supply voltage $V_{IN}$, or the positive power supply $V_{CC}$, the normally-off device M1 is controlled to be OFF. In one embodiment of the present invention, the normal operation means no fault (e.g. no under voltage condition, no input unplug condition, etc.) is happened.

The normally-on device J1 is controlled to switch between ON and OFF statuses in response to the PWM signal. The PWM signal is typically provided by a controller (not shown) which is used to control the power devices (e.g. the normally-on device) to switch between ON and OFF, so that a desired output voltage will be obtained from a bus voltage. When the PWM signal is high, the first driver 11 is configured to control the normally-on device J1 to be ON; and when the PWM signal is low, the first driver 11 is configured to control the normally-on device J1 to be OFF. The normally-on device J1 is controlled to be OFF by pulling its control terminal (e.g. its gate) to a negative voltage with respect to its source or with respect to the second terminal S. For example, the first driver 11 is configured to pull the control terminal (e.g. the gate) of the normally-on device J1 to the negative power supply $V_{NEG}$ to turn off the normally-on device J1. The normally-on device J1 is controlled to be ON by not pulling its gate to the negative voltage with respect to its source (e.g., let its gate idle). For example, the normally-on device J1 is controlled to be ON by coupling its gate to the second terminal S.

In one embodiment of the present invention, the normally-off device M1 is controlled to be ON by pulling its control terminal (e.g., its gate) to a positive voltage with respect to its source (i.e. the second terminal S). For example, the second driver 12 is configured to pull the control terminal (e.g. the gate) of the normally-off device M1 to the positive power supply $V_{CC}$ to turn on the normally-off device M1. The normally-off device M1 is controlled to be OFF by not pulling its control terminal to the positive voltage with respect to its source. For example, the normally-off device M1 is controlled to be OFF by coupling its gate to the second terminal S.

Figure 3:
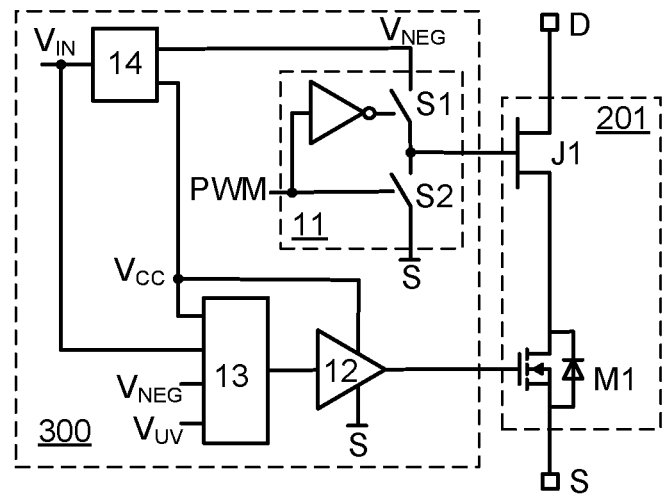
FIG. 3 schematically shows a gate driver 300 with a detailed circuit configuration of the first driver 11 in accordance with an embodiment of the present invention.

FIG. 3 schematically shows a gate driver 300 with a detailed circuit configuration of the first driver 11 in accordance with an embodiment of the present invention. In the example of FIG. 3, the first driver 11 comprises: a first switch S1, configured to couple the control terminal of the normally-on device J1 to the negative power supply $V_{NEG}$; and a second switch S2, configured to couple the control terminal of the normally-on device J1 to the second terminal S.

In one embodiment of the invention, when the PWM signal is high, the first switch S1 is turned off, and the second switch S2 is turned on, to pull the control terminal of the normally-on device J1 to the second terminal S. When the PWM signal is low, the first switch S1 is turned on, and the second switch S2 is turned off, to pull the control terminal of the normally-on device J1 to the negative power supply $V_{NEG}$.

Figure 4:
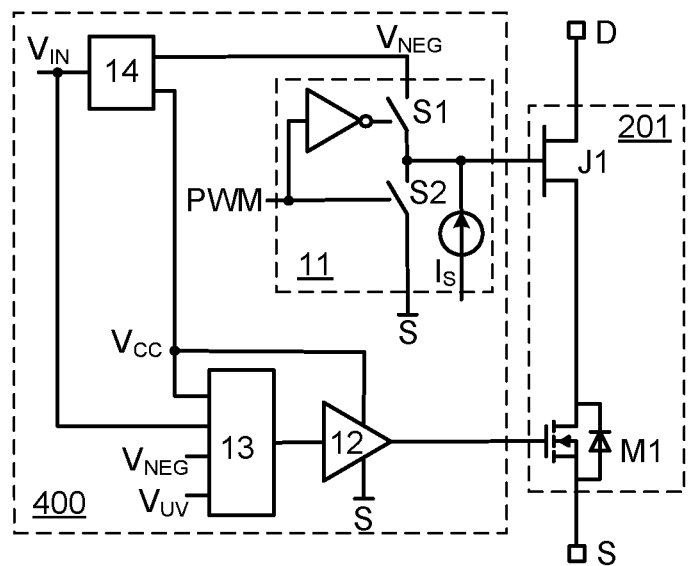
FIG. 4 schematically shows a gate driver 400 with a detailed circuit configuration of the first driver 11 in accordance with an embodiment of the present invention.

FIG. 4 schematically shows a gate driver 400 with a detailed circuit configuration of the first driver 11 in accordance with an embodiment of the present invention. The first driver 11 in FIG. 4 is similar as the first driver 11 in FIG. 3, with a difference that in the example of FIG. 4, the first driver 11 further comprises: a current source $I_S$, configured to be continuously fed into the control terminal of the normally-on device J1 after J1's end of the turn-on transition, until the normally-on device J1 is controlled to be turned off.

In one embodiment of the present invention, J1's end of the turn-on transition means the normally-on device J1 is fully turned on.

Figure 5:
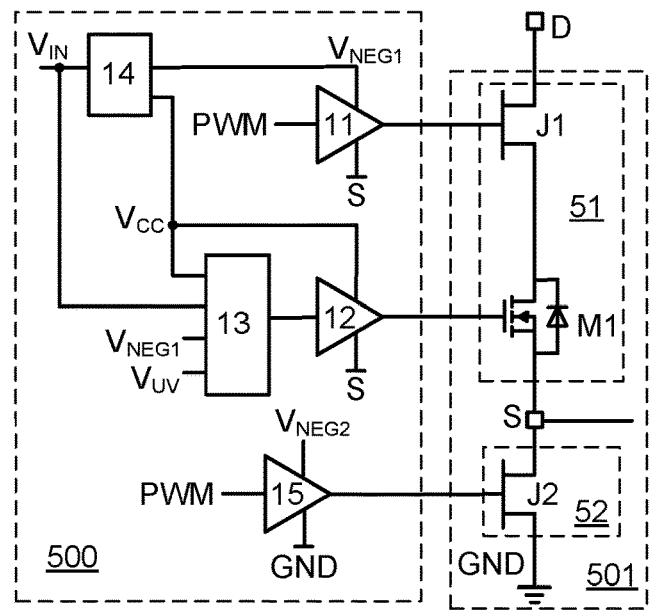
FIG. 5 schematically shows a gate driver 500 in accordance with an embodiment of the present invention.

FIG. 5 schematically shows a gate driver 500 in accordance with an embodiment of the present invention. In the example of FIG. 5, the gate driver 500 is configured to drive a half-bridge circuit 501. The half-bridge circuit 501 comprises: a high-side power device 51 including a first normally-on device J1 and a normally-off device M1 coupled in series between a first terminal D and a second terminal S, and a low-side power device 52 including a second normally-on device J2 coupled between the second terminal S and a reference ground GND. The gate driver 500 comprises: a first driver 11, configured to receive a PWM signal, and to drive the first normally-on device J1; a second driver 12, configured to drive the normally-off device M1; and a third driver 15, configured to receive the PWM signal, and to drive the second normally-on device J2.

In one embodiment of the present invention, the half-bridge circuit 501 is configured to convert a bus voltage to an output voltage, which is provided to a post-stage (not shown).

When the PWM signal is low, the first driver 11 is configured to pull a control terminal of the first normally-on device J1 to a first negative voltage $V_{NEG1}$, to control the first normally-on device J1 to be OFF; and the third driver 15 is configured to pull a control terminal of the second normally-on device J2 to the reference ground GND, to control the second normally-on device J2 to be ON. When the PWM signal is high, the first driver 11 is configured to pull the control terminal of the first normally-on device J1 to the second terminal S, to control the first normally-on device J1 1to be ON; and the third driver 15 is configured to pull the control terminal of the second normally-on device J2 to a second negative power supply $V_{NEG2}$, to control the second normally-on device J2 to be OFF.

In the example of FIG. 5, the gate driver 500 further comprises: an under voltage detector 13, configured to detect an under voltage condition of the first negative power supply $V_{NEG1}$, an input supply voltage $V_{IN}$, and a positive power supply $V_{CC}$ of the second driver 12. If any one of the first negative power supply $V_{NEG1}$, the input supply voltage $V_{IN}$, or the positive power supply $V_{CC}$ is in an under voltage condition, the normally-off device M1 is controlled to be OFF by the second driver 12.

In the example of FIG. 5, the gate driver 500 further comprises: a converting circuit 14, configured to convert the input supply voltage $V_{IN}$ to the positive power supply $V_{CC}$ (e.g., the converting circuit 14 may comprise a low dropout regulator to perform the conversion), to convert the input supply voltage $V_{IN}$ to the first negative power supply $V_{NEG1}$ (e.g., the converting circuit 14 may comprise a first charge pump to perform the conversion), and to convert the input supply voltage $V_{IN}$ to the second negative power supply $V_{NEG2}$ (e.g., the converting circuit 14 may comprise a second charge pump to perform the conversion).

Figure 6:
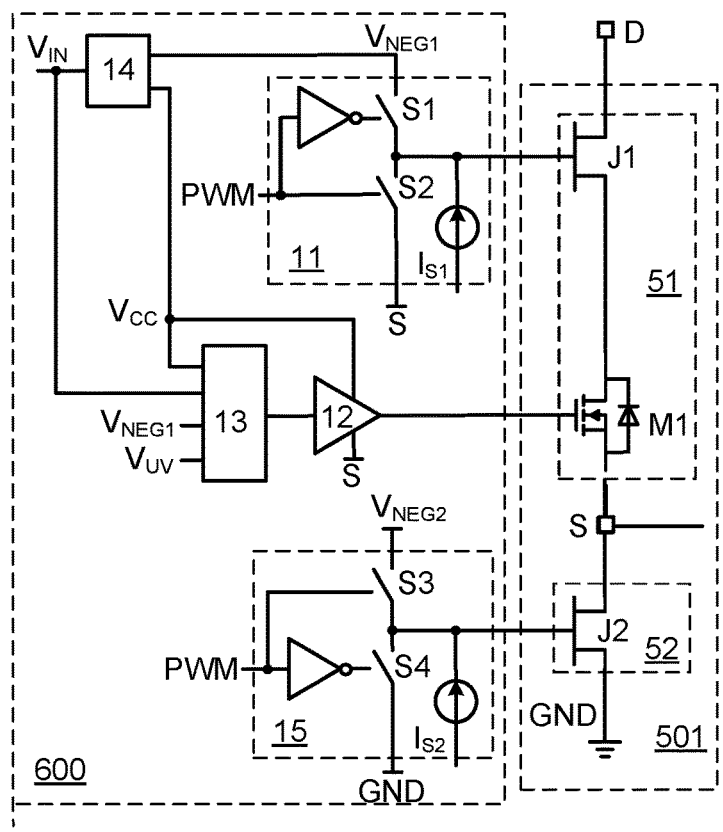
FIG. 6 schematically shows a gate driver 600 with detailed circuit configurations of the first driver 11 and the third driver 15 in accordance with an embodiment of the present invention.

FIG. 6 schematically shows a gate driver 600 with detailed circuit configurations of the first driver 11 and the third driver 15 in accordance with an embodiment of the present invention. In the example of FIG. 6, the first driver 11 comprises: a first switch S1, configured to couple the control terminal of the first normally-on device J1 to the first negative power supply $V_{NEG1}$; and a second switch S2, configured to pull the control terminal of the first normally-on device J1 to the second terminal S.

In the example of FIG. 6, the first driver 11 further comprise: a first current source $I_{S1}$ configured to be continuously fed into the control terminal of the first normally-on device J1 after the first normally-on device J1 is fully turned on, until the first normally-on device J1 is controlled to be turned off.

In the example of FIG. 6, the third driver 15 comprises: a third switch S3, configured to couple the control terminal of the second normally-on device J2 to the second negative power supply $V_{NEG2}$; and a fourth switch S4, configured to pull the control terminal of the second normally-on device J2 to the reference ground GND.

In the example of FIG. 6, the third driver 15 further comprise: a second current source $I_{S2}$, configured to be continuously fed into the control terminal of the second normally-on device J2 after the second normally-on device J2 is fully turned on, until the second normally-on device J2 is controlled to be turned off.

The example in FIG. 6 schematically shows that the first driver 11 comprises the first current source $I_{S1}$, and the third driver 15 comprises the second current source $I_{S2}$. However, one skilled in the art should realize that the first driver 11 in the gate driver 600 may not include the first current source $I_{S1}$, as that shown in the example of FIG. 3; and the third driver 15 in the gate driver 600 may not include the second current source $I_{S2}$, either.

Figure 7:
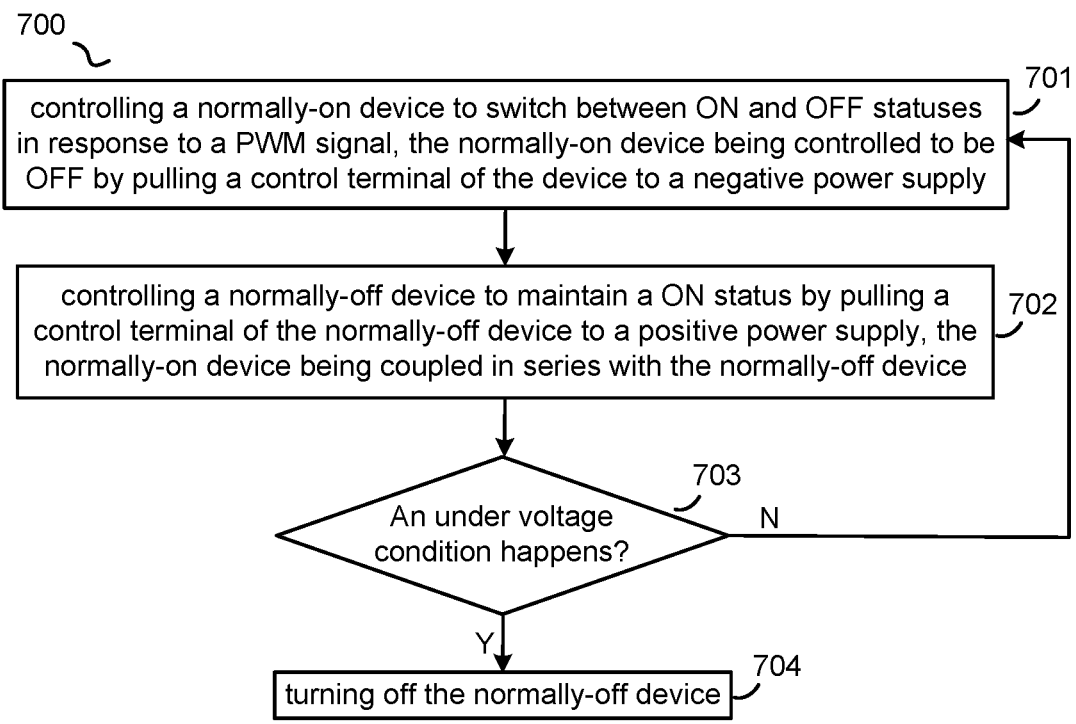
FIG. 7 schematically shows a flowchart 700 of a driving method in accordance with an embodiment of the present invention.

FIG. 7 schematically shows a flowchart 700 of a driving method in accordance with an embodiment of the present invention. The method comprises:

Step 701, controlling a normally-on device to switch between ON and OFF statuses in response to a PWM signal, the normally-on device being controlled to be OFF by pulling a control terminal of the device to a negative power supply.

Step 702, controlling a normally-off device to maintain an ON status by pulling a control terminal of the normally-off device to a positive power supply, the normally-on device being coupled in series with the normally-off device.

Step 703, monitoring an under voltage condition of the negative power supply or the positive power supply, if any of the negative power supply or the positive power supply is in the under voltage condition, going to step 704.

Step 704, turning off the normally-off device.

In one embodiment of the present invention, when the PWM signal is high, controlling the normally-on device to be ON; and when the PWM signal is low, controlling the normally-on device to be OFF.

In one embodiment, the negative power supply and the positive power supply are both converted from an input supply voltage.

In one embodiment, the method further comprising: monitoring an under voltage condition of the input supply voltage, if the input supply voltage is in the under voltage condition, turning off the normally-off device.

Several embodiments of the foregoing gate driver directly access the control terminal of the normally-on device, which improves the switching performance and reduces the ON resistance. In addition, the normally-off device is fully ON in normal operation, unless an under voltage condition is detected. Thus no voltage stress is applied to the normally-off device in normal operation. Further, in the half-bridge circuit, only one normally-off device is needed, which reduces the cost, and improves the switching performance.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

What is claimed is:

1. A gate driver, configured to drive a power device, the power device having a normally-on device and a normally-off device coupled in series between a first terminal and a second terminal, the gate driver comprising:
   a first driver, configured to receive a PWM signal, and to drive the normally-on device;
   a second driver, configured to drive the normally-off device;
   an under voltage detector, configured to detect an under voltage condition of a negative power supply of the first driver, a positive power supply of the second driver, and an input supply voltage; wherein when any one of the negative power supply, the input supply voltage, or the positive power supply is in an under voltage condition, the normally-off device is controlled to be OFF by the second driver; and a converting circuit, configured to convert the input supply voltage to the positive power supply, and to the negative power supply.

2. The gate driver of claim 1, wherein:
when the PWM signal is high, the first driver is configured to control the normally-on device to be ON; and
when the PWM signal is low, the first driver is configured to control the normally-on device to be OFF.

3. The gate driver of claim 1, wherein the first driver comprises:
a first switch, configured to couple a control terminal of the normally-on device to the negative power supply when the PWM signal is low; and
a second switch, configured to couple the control terminal of the normally-on device to the second terminal when the PWM signal is high.

4. The gate driver of claim 3, wherein the first driver further comprises:
a current source, configured to be continuously fed into the control terminal of the normally-on device when the normally-on device is fully on.

5. The gate driver of claim 1, wherein:
the normally-off device is controlled to maintain ON by the second driver in normal operations.

6. The gate driver of claim 1, wherein:
the normally-on device has a control terminal and a source terminal, and wherein the normally-on device is controlled to be OFF by pulling its control terminal to the negative power supply.

7. The gate driver of claim 1, wherein:
the normally-off device has a control terminal and a source terminal, and wherein the normally-off device is controlled to be ON by pulling the control terminal to the positive power supply.

8. The gate driver of claim 1, wherein:
the normally-on device comprises a high voltage JFET; and
the normally-off device comprises a low voltage MOSFET.

9. A gate driver, configured to drive a half-bridge circuit, the half-bridge circuit having a high-side power device and a low-side power device, the high-side power device including a first normally-on device and a normally-off device coupled in series between a first terminal and a second terminal, the low-side power device including a second normally-on device coupled between the second terminal and a reference ground, the gate driver comprising:
a first driver, configured to receive a PWM signal, and to drive the first normally-on device;
a second driver, configured to drive the normally-off device;
a third driver, configured to receive the PWM signal, and to drive the second normally-on device; wherein the third driver comprises: a first switch and a second switch, wherein the first switch is configured to couple the control terminal of the second normally-on device to a second negative power supply, and the second switch is configured to pull the control terminal of the second normally-on device to the reference ground; and
an under voltage detector, configured to detect an under voltage condition of a first negative power supply of the first driver, an input supply voltage, and a positive power supply of the second driver; wherein when any one of the negative power supply, the input supply voltage, or the positive power supply is in an under voltage condition, the normally-off device is controlled to be OFF by the second driver.

10. The gate driver of claim 9, wherein:
when the PWM signal is high, the first driver is configured to control the first normally-on device to be ON, and the third driver is configured to control the second normally-on device to be OFF; and
when the PWM signal is low, the first driver is configured to control the first normally-on device to be OFF, and the third driver is configured to control the second normally-on device to be ON.

11. The gate driver of claim 9, wherein:
the normally-off device is controlled to maintain ON by the second driver in normal operations.

12. The gate driver of claim 9, wherein the first driver comprises:
a third switch, configured to couple a control terminal of the first normally-on device to the negative power supply when the PWM signal is low; and
a fourth switch, configured to couple the control terminal of the first normally-on device to the second terminal when the PWM signal is high.

13. The gate driver of claim 12, wherein the first driver further comprises:
a current source, configured to be continuously fed into the control terminal of the first normally-on device when the first normally-on device is fully on.

14. The gate driver of claim 9, wherein the third driver further comprises:
a current source, configured to be continuously fed into the control terminal of the second normally-on device when the second normally-on device is fully on.

15. A driving method, comprising:
controlling a normally-on device to switch between ON and OFF statuses in response to a PWM signal, the normally-on device being controlled to be OFF by pulling a control terminal of the device to a negative power supply;
controlling a normally-off device to maintain an ON status by pulling a control terminal of the normally-off device to a positive power supply, the normally-on device being coupled in series with the normally-off device; wherein the negative power supply and the positive power supply are both converted from an input supply voltage; and
monitoring an under voltage condition of the negative power supply and the positive power supply: when any one of the negative power supply or the positive power supply is in the under voltage condition, turning off the normally-off device.

16. The driving method of claim 15, wherein:
when the PWM signal is high, controlling the normally-on device to be ON; and
when the PWM signal is low, controlling the normally-on device to be OFF.

17. The driving method of claim 15, further comprising:
monitoring an under voltage condition of the input supply voltage, if the input supply voltage is in the under voltage condition, turning off the normally-off device.

\* \* \* \* \*